United States Patent
Brunner et al.

(10) Patent No.: US 11,592,534 B2
(45) Date of Patent: Feb. 28, 2023

(54) CONTROLLING AN OSCILLATING SYSTEM (71) Applicant: Infineon Technologies AG, Neubiberg (DE)

(72) Inventors: David Brunner, Dobersberg (AT); Georg Schitter, Vienna (AT); Han Woong Yoo, Vienna (AT)

(73) Assignee: Infineon Technologies AG, Neubiberg (DE)

( * ) Notice: Subject to any disclaimer, the term of this patent is extended or adjusted under 35 U.S.C. 154(b) by 297 days.

(21) Appl. No.: 16/909,098

(22) Filed: Jun. 23, 2020

(65) Prior Publication Data

US 2021/0011134 A1    Jan. 14, 2021

(30) Foreign Application Priority Data

Jul. 11, 2019    (DE) .......................... 102019210305.7

(51) Int. Cl.
*G01S 7/481*     (2006.01)
*G02B 26/08*     (2006.01)
(Continued)

(52) U.S. Cl.
CPC ............ *G01S 7/4817* (2013.01); *G01S 7/497* (2013.01); *G02B 26/0833* (2013.01);
(Continued)

(58) Field of Classification Search
CPC ............ H03B 5/32; H03B 5/30; H03B 5/323; H03B 5/06; H03B 2200/0094; H03L 3/00; G01S 7/4817; G01S 7/497; G02B 26/105; G02B 26/0833; G02B 26/0841; G01P 15/097; G01C 19/56; G01C 19/5607; G01C 19/5621; G01C 19/5614; G01C 19/5656;
(Continued)

(56) References Cited

U.S. PATENT DOCUMENTS 4,965,532 A    10/1990  Sakurai
10,581,378 B1 *  3/2020  Verhoef ............... H03K 3/0307
(Continued)

FOREIGN PATENT DOCUMENTS

WO    2012027410 A1    3/2012

*Primary Examiner* — Ryan Johnson
(74) *Attorney, Agent, or Firm* — Harrity & Harrity, LLP (57) ABSTRACT

A system includes a power driver, configured to generate an electric excitation; an oscillating system, configured to perform an oscillation induced by the electric excitation; a feedback detector, configured to detect a feedback measurement signal with to the oscillation; and a controller configured to operate: in a closed loop mode, to control the power driver to generate the electric excitation as a discontinuous electric excitation according to timing information obtained from the detected feedback measurement signal, to synchronize the discontinuous electric excitation with the detected feedback measurement signal; in a learning mode preceding the closed loop mode, to control the power driver to generate the electric excitation as a continuous electric excitation, to obtain timing information from the feedback measurement signal to be used, at least once, in the subsequent closed loop mode, to synchronize the discontinuous electric excitation with the detected feedback measurement signal.

23 Claims, 7 Drawing Sheets

(51) Int. Cl.
*H03B 5/06* (2006.01)
*G02B 26/10* (2006.01)
*H03B 5/30* (2006.01)
*H03L 3/00* (2006.01)
*G01S 7/497* (2006.01)

(52) U.S. Cl.
CPC ............ *G02B 26/105* (2013.01); *H03B 5/06* (2013.01); *H03B 5/30* (2013.01); *H03L 3/00* (2013.01); *H03B 2200/0094* (2013.01)

(58) Field of Classification Search
CPC ............ G01C 19/5649; G01C 19/5642; G01C 19/5726; G01C 19/5762; G01C 19/5776
See application file for complete search history.

(56) References Cited

U.S. PATENT DOCUMENTS

| | | | |
|---|---|---|---|
| 10,998,856 B1* | 5/2021 | Fang | H03B 5/06 |
| 2005/0264366 A1* | 12/2005 | Zivanovic | H03B 5/06 |
| | | | 331/16 |
| 2011/0197674 A1* | 8/2011 | Prandi | G01C 19/5726 |
| | | | 73/504.12 |
| 2017/0219817 A1* | 8/2017 | Horibe | G02B 26/0833 |

* cited by examiner

CONTROLLING AN OSCILLATING SYSTEM

RELATED APPLICATION

This application claims priority to German Patent No. 102019210305.7, filed on Jul. 11, 2019, which is incorporated herein by reference in its entirety.

FIELD

The present examples relate to techniques for controlling an oscillating system, in particular at the startup. The examples relate to systems, methods, and non-transitory memory units which cause a processor to execute the methods.

BACKGROUND

In some technical fields, an oscillating system is required, e.g., for causing the oscillation of a mechanical element. An example may be a light detection and ranging (LIDAR) application, in which the oscillation of a mirror is caused, so that laser light impinges the mirror at desired angles.

The oscillating system can in general be described by a state, which is partly due to mechanical, structural, and geometric properties and partly to electric properties of the electric excitation (e.g., voltage or frequency of the excitation signal). There are known stable states (which tend to be maintained) and unstable states (which tend to move towards different states). In applications, in a graph which associates oscillation frequency and a mechanical angular amplitude, it is possible to recognize stable curves (formed by stable states) and unstable curves (formed by unstable states).

In order to increase quality and reliability, it is in general preferred to operate an oscillating system in a stable state. An oscillating system may be meant at operating in a stable state, in which an electric excitation provides the energy which is dissipated, for example, by a mechanical response.

However, at the startup, the intended stable state cannot in general be promptly and easily reached. To arrive at the stable state associated to a desired angular amplitude, it is in general necessary to move along a stable curve, i.e., to slowly sweep, state-by-state, along a plurality of the stable states which form the stable curve, up to the intended stable state which is associated to the desired angle.

Ideally, it could be possible, at the startup, to intercept an unstable curve which quickly drives to the intended stable state. However, this is not an easy task, as timing information (e.g., phase between the excitation signal and the response signal) should be known. The phase information is, at the startup, in general unknown, and, therefore, the strategy of intercept the unstable curve is in general not used in open loop. Therefore, at the startup, it is in general necessary to slowly move along a stable curve.

Alternative solutions are based on the use of additional sensors (e.g., mechanical sensors, acceleration sensors, angel sensors, velocity sensors, accelerometric sensor, gyro sensors, etc), which, however, is preferable not to use.

It is intended to find a technique which speeds up the startup without the necessity of using additional sensors.

SUMMARY

In accordance to an aspect, there is provided a system including: a power driver, configured to generate an electric excitation; an oscillating system, configured to perform an oscillation induced by the electric excitation; a feedback detector, configured to detect a feedback measurement signal associated to the oscillation; and a controller. The controller is configured to operate: in a closed loop mode, to control the power driver to generate the electric excitation as a discontinuous electric excitation according to timing information obtained from the detected feedback measurement signal, to synchronize the discontinuous electric excitation with the detected feedback measurement signal; and in a learning mode preceding the closed loop mode, to control the power driver to generate the electric excitation as a continuous electric excitation, to obtain timing information from the feedback measurement signal to be used, at least once, in the subsequent closed loop mode, to synchronize the discontinuous electric excitation with the detected feedback measurement signal.

Accordingly, in the learning mode it is possible to determine timing information (e.g. phase information, frequency information) to be subsequently used in the subsequent closed loop mode. By knowing the timing information, it is possible to intercept the unstable curve and to quickly move towards the desired stable state.

In the learning mode, the controller may evaluate a particular condition (second timing-related condition): for example, the controller may evaluate the number of zero-crossing events of the electric current, to obtain timing information (frequency information, phase information). When the second timing-related condition is fulfilled (e.g., a particular number of zero-crossing events has occurred), the controller may reliably determine which phase and which frequency the electric excitation shall subsequently have.

In accordance to an aspect, there may be also provided an initial open loop mode preceding the learning mode, so as to control the power driver to generate the electric excitation as a discontinuous electric excitation in the absence of synchronization with the feedback measurement signal.

Hence, initially the system may operate in an open loop mode, and move to the learning mode at the determination of the fulfilment of a particular condition (first timing-related condition): for example, the controller may evaluate the occurrence of a particular zero-crossing event of the electric current, to obtain timing information (e.g., frequency information, phase information, etc.). Accordingly, the controller knows that the learning mode may start, and for example knows the initial time instant of the learning mode, which will be subsequently used for deriving the timing information in the learning mode. The final instant of the learning mode permits to determine the whole duration of the time window of the learning mode, hence giving information on the frequency of the oscillator. Phase information is also obtained when the final instant of the learning mode is known.

Subsequently, in the closed loop mode, the controller may operate by applying the frequency of the response signal (detected feedback measurement), e.g. with a zero phase. This result may be obtained by monitoring a particular condition (third timing-related condition): for example, the controller may evaluate whether a particular zero-crossing event has occurred, to obtain timing information (frequency information, phase information).

Accordingly, in the closed loop mode, the oscillation will quickly move towards the intended stable state.

In the closed loop mode, the electric excitation may be a square signal (or rectangular, bistate), in which, for each time period, an initial OFF state (null electric excitation) may precede an ON state (electric excitation different from zero). The phase and the frequency of the electric excitation may be controlled in real time. In fact, for each time period, the frequency may be calculated based on the frequency of the previous time period (or on the frequency determined from the whole duration of the time window of the learning mode). Further, each time period may be abruptly truncated at the determination of the zero-crossing event (hence initiating a new time period, to maintain the electric excitation in phase with the measurement signal). Notably, the zero-crossing events are monitored when the electric excitation is ON, which otherwise would not be possible.

These results may be obtained using a so-called sensorless equipment: for example, there is no need for a measurement of mechanical magnitudes, while it is simply possible to rely on measurements of electric magnitudes (e.g., electric current, in particular zero-crossing events).

In accordance to an aspect, there is provided a light detection and ranging, LIDAR, system, including a system according to any of the preceding claims, wherein the oscillating system includes a mirror, wherein the LIDAR system further includes control equipment to perform a scanning control by controlling a laser driver to cause the generation of laser light pulses to be impinged onto the mirror.

In accordance to an aspect, there is provided a method including at least one of the following steps: an initial open loop step, to control a power driver to generate the electric excitation as a discontinuous electric excitation in open loop; a learning step, to control the power driver to generate an electric excitation as a continuous electric excitation, to obtain timing information from feedback measurement signal; and a closed loop step, to control the power driver to generate the electric excitation as a discontinuous electric excitation according to timing information obtained from the detected feedback measurement signal, to synchronize the discontinuous electric excitation with the detected feedback measurement signal.

It is also possible to have a non-transitory memory unit storing instructions which, when executed by a processor (e.g., the controller), cause the processor to perform the method above.

DETAILED DESCRIPTION

Figure 1:
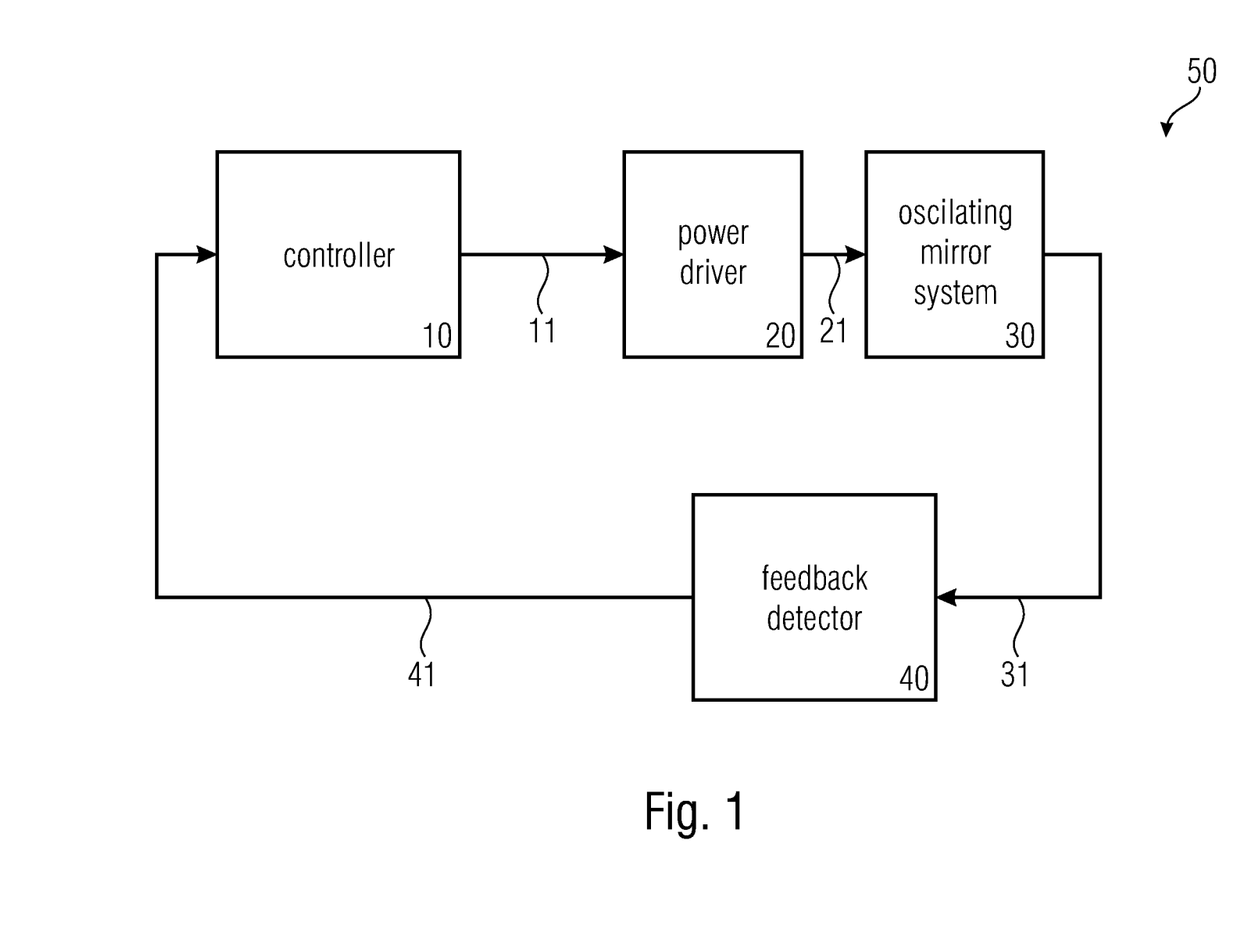
FIG. 1 shows a system according to an example.

FIG. 1 shows a system 50. The system 50 may cause mechanic oscillations, for example. The system 50 may be part of a LIDAR system, for example.

The system 50 may comprise a controller 10, which may include a processor or another logic element.

The system 50 may comprise am oscillating system (oscillator) 30, configured to perform an oscillation induced by electric excitation 21. The oscillating system 30 may be of the type including a mirror (e.g., a micro-electro-mechanical system, MEMS, mirror).

The system 50 may comprise a power driver 20. The power driver 20 may be configured to generate the electric excitation 21. The power driver 20 may be controlled by the controller 10.

The power driver 20 may control an actuator which causes the oscillations of the oscillator. The actuator may include interdigitated finger electrodes. The actuator may include an interdigitated structure, in which frame combs (which are integral with a fixed, non-rotating part) are interdigitated with rotatable combs (with are integral with a rotating part, e.g. the mirror). The electric excitation 21 may be applied to the actuator by the power driver 20. The electric excitation 21 applied to the finger structure may generate a corresponding attraction between the electrodes of the actuator. The electric excitation 21 across the finger structure may create a driving force (e.g., attraction between positive charges and negative charges) between interdigitated rotatable combs and the frame combs, which may create a torque, so that on the mirror (or another rotating part) rotates about a rotation axis. The electric excitation 21 may be of the type switched or toggled on-and-off. The electric excitation 21 may cause an oscillating driving force. The oscillating driving force may cause the mirror (or another rotating part) to oscillate back and forth on its rotation axis between two extrema. As the mirror (or another rotating part) oscillates, the capacitance between the finger electrodes changes according to the mirror's position, e.g., by virtue of the different distance between the interdigitated electrodes. In examples, the electric current may be zero at the maximum angles and at a zero angle.

The system 50 may comprise a feedback detector 40. The feedback detector 40 may be configured to detect a feedback measurement signal 41 associated to the oscillation. In particular, the feedback detector 40 may perform electric measurements (e.g., measurements of current), and in particular zero-crossing measurements (e.g., time-stamped information regarding the instant in which the electric current has reached a zero value). The measurement performed by the feedback detector 40 may be at least partially based on determining the increment of a sensed electric magnitude: for example, the feedback detector 40 may provide information whether a zero-crossing event has been occurred from a positive electric current towards a negative electric current.

An example of feedback measurement signal 41 obtained by the feedback detector 40 is here discussed, e.g., based on measurements on capacitances (other techniques may notwithstanding be implemented). The feedback detector 40 may measure the capacitance between the interdigitated finger electrodes, and determine a rotation position or angle position of the mirror (or another rotating part) therefrom. By monitoring the capacitance, zero-crossing events (or other events associated to the passage at specific angles), and a timing thereof may be determined, hence obtaining feedback measurement signal 41 (which may be provided to the controller 10). The feedback detector 40 may be configured to measure the capacitance or a quantity associated to the capacitance. For example, as the mirror (or another rotating part), the geometry of the interdigitated-finger structure changes, resulting in a change of the geometry (e.g. change in the distance between the electrodes of the capacitor or change in the angle between the electrodes of the capacitor). As the geometry of the interdigitated-finger structure changes, the capacitance itself changes. A specific capacitance $C(\theta)$ corresponds with a specific rotation angle $\theta$, by virtue of the modified geometry. By sensing the capacitance $C(\theta)$ of the finger structure, a specific position of the mirror (or another rotating part) can therefore be determined.

Another example of feedback measurement may be a measurement of electric current. The electric current is in general the derivative of the capacitance $$\left(I = \frac{dC}{dt},\right.$$

or equivalently $$\left.I = \frac{dC}{d\theta}\frac{d\theta}{dt}\right).$$

At zero-crossing, $$\frac{dC}{d\theta} = 0,$$

and therefore I=0. The passage of the oscillator for a zero-angle position may therefore be determined when the current I is 0 and the current gradient $$\frac{dI}{dt}$$

is negative. Therefore, it is possible to monitor zero-crossing events in the electric current, and also the derivative of the current may be taken into consideration.

The controller 10 may obtain (at least in some operation modes) the feedback measurement signal 41.

The controller 10 may exert a control on the oscillation according to at least one of the following modes:

an initial open loop mode, so as to control the power driver 20 to generate the electric excitation 21 in the absence of synchronization with the feedback measurement signal 41;

a learning mode, to control the power driver 20 to generate the electric excitation 21 in such a way to obtain timing information from the feedback measurement signal 41;

in a closed loop mode, to control the power driver 20 to generate the electric excitation 21 according to timing information obtained from the detected feedback measurement signal 41, to synchronize the discontinuous electric excitation 21 with the detected feedback measurement signal 41.

A transition from one mode to a subsequent mode may be triggered by the determination of the occurrence a particular event (e.g., zero-crossing event). For example, the transition to the learning mode may be triggered by the detection of a first zero-crossing event (e.g., a detection of the electric current, crossing the zero value from a positive value to a negative value). In addition, or alternatively, the transition to the closed loop mode may be triggered by the detection of a second zero-crossing event (e.g., a detection of a preselected number of the occurrences of electric current crossing the zero value from a positive value to a negative value). In the closed loop mode, a third condition may be evaluated: for example, at the determination of a zero-crossing event (e.g., a detection of the electric current crossing the zero value from a positive value to a negative value), the timing of the electric excitation 21 may be updated, e.g., by using the same frequency and phase of the detected feedback measurement signal 41.

Accordingly, at least one of the following consequences are implied. In the open loop mode, the electric excitation 21 (which may be discontinuous) may be unrelated to the oscillations. When the first timing-related condition is determined, the controller may start the learning mode, in which a fixed voltage is applied, while the oscillator continues oscillating. Meanwhile, the controller 10 monitors the occurrence of the second timing-related condition and counts the time elapsing from the occurrence first timing-related condition. When the occurrence of the second timing-related condition is determined, the controller 10 knows timing information associated to the oscillation. For example, by determining the time elapsed from the first timing-related condition to the second timing-related condition the controller 10 may determine the period of the oscillation. In addition, or alternative, if timing-related condition is a zero-crossing condition, the controller 10 also determines the phase of the signal.

Accordingly, at the end of the learning mode, the electric excitation 21 may be generated as a signal which is in phase with the feedback measurement signal 41 (and the oscillation in turn) and whose frequency is associated to the frequency of the oscillation (e.g., by defining a period of the electric excitation 21 to have a frequency associated to the frequency of the oscillation).

Basically, in closed loop the system 50 may be understood as operating as a phase locked loop, PLL, which is synchronized on the feedback measurement signal 41 (and the oscillation in turn).

It has been understood that, accordingly, it is possible to quickly intercept, in the learning mode, the unstable curve, and, by synchronizing the electric excitation 21 to the feedback measurement signal 41, the oscillation is quickly moved, along the unstable curve, towards the intended stable state at the desired mechanical angular amplitude.

Figure 2:
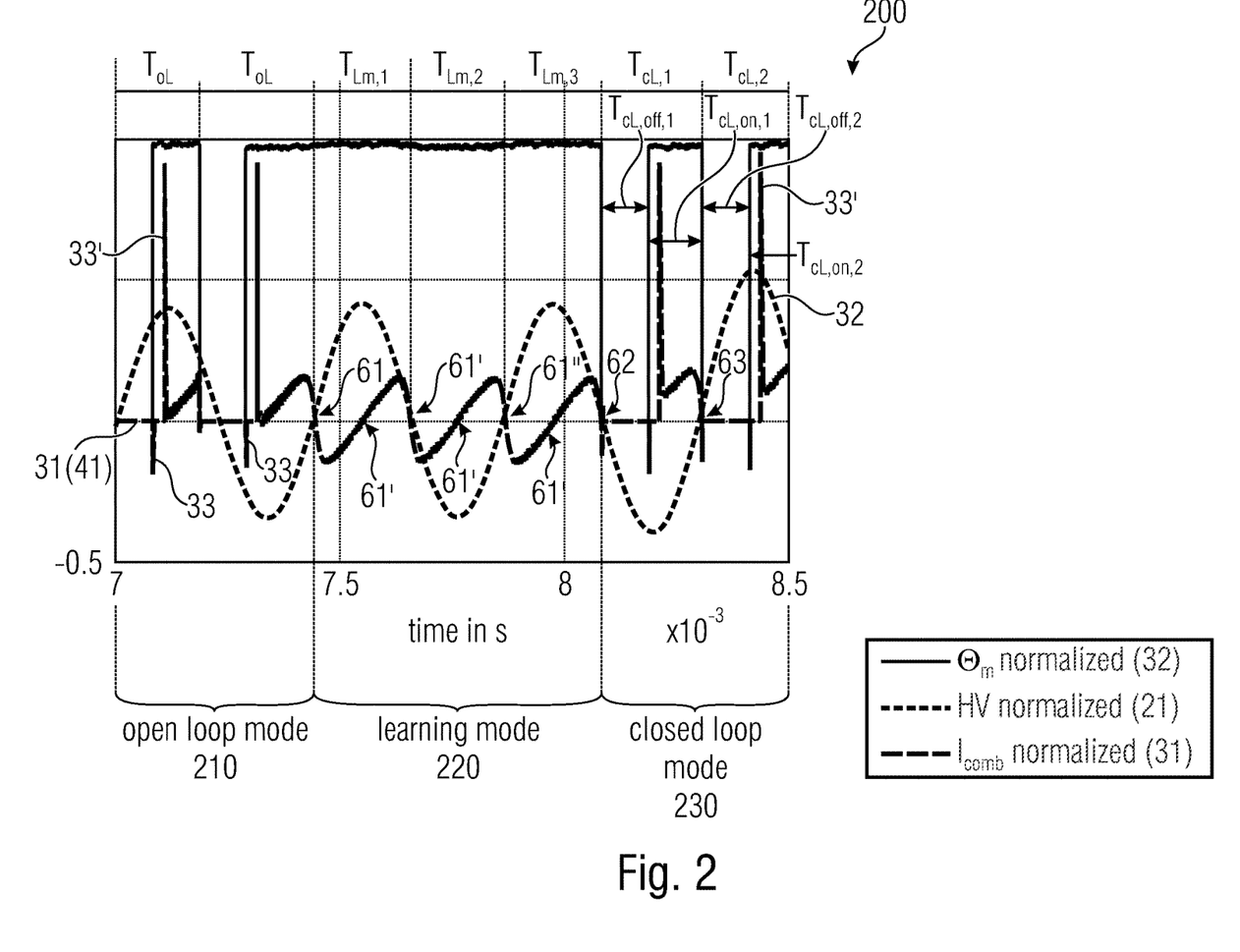
FIG. 2 shows an operation according to an example.
Figure 3:
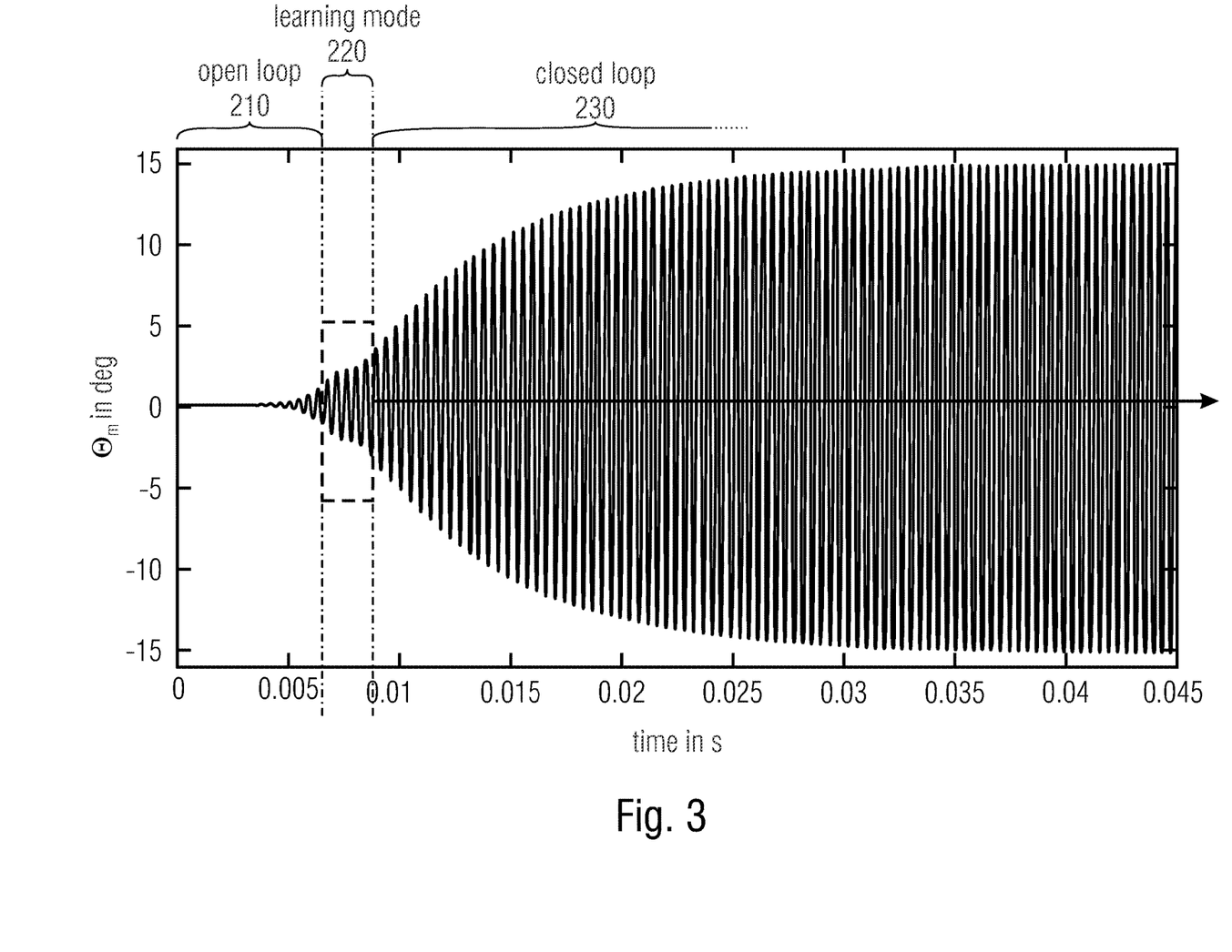
FIG. 3 shows an operation according to an example.

FIGS. 2 and 3 show the behavior of the system 50 in the open loop mode 210, in the subsequent learning mode 220, and in the further subsequent closed loop mode 230. In particular, there are shown:

the electric excitation 21 (here also indicated as "HV normalized");

the electric current 31 (here also indicated as "$I_{comb}$ normalized"); and the status 32 of the oscillator 30 (e.g., angle $\theta_m$ or the instantaneous position or angle of the mirror), which in this case is not directly observable.

Conditions associated to the status of the oscillator may be reconstructed from the measurement 41 of the electric current or by other magnitudes, such as capacitance, voltage, etc.

At first, the power driver 20 initially operates in the open loop mode 210. The electric excitation 21 (HV) may be provided by the power driver 20, e.g. under the control of the controller 10. The electric excitation 21 in the open loop mode 210 is shown as a periodical square signal or rectangle signal (or bistate signal), with a period $T_{OL}$. In the open loop mode 210, the electric excitation 21 is not synchronized with feedback measurement signal 41. The electric excitation 21 is synchronized, for example, with an external clock signal (not shown). As can be seen from FIGS. 2 and 3, the oscillator starts oscillating with gradually increased amplitude. In general terms, the current cannot be observed when the electric excitation is zero: since the excitation signal 21 and the oscillation have arbitrary phase, it would be difficult to obtain information on the current signal.

The open loop mode 210 may end at the determination of the fulfilment of a first timing-related condition, which may be the determination that the electric current has crossed a zero value, e.g. from a positive value towards a negative value (values different from zero may also be monitored in some examples). The fulfilment of the first timing-related condition (which is here the detection of a zero-crossing event) is indicated with 61 in FIG. 2. Accordingly, a first information on the timing of the current is achieved.

It is now possible to initiate, e.g. under the control of the controller 10, a learning mode 220, in which the electric excitation 21 generated by the power driver 20 has a continuous value (e.g., one single level of voltage). Meanwhile, the oscillator continues oscillating, and the electric current 31 is non-continuous. The electric current 31 may be detected as feedback measurement signal 41 and provided to the controller 10. From the feedback measurement signal 41, the controller 10 may derive timing information (such as phase, frequency) regarding the state of the oscillating system. Zero-crossing events 61'' may be recognized in the learning mode 220, which delimit multiple periods $T_{LM,1}$, $T_{LM,2}$, $T_{LM,3}$ of the electric current (each period $T_{LM,1}$, $T_{LM,2}$, $T_{LM,3}$ is in general associated to a semi-period of the mechanical oscillation, and the events 61'' are in general associated to the oscillator reaching a zero-angle position). By monitoring the lengths $T_{LM,1}$, $T_{LM,2}$, $T_{LM,3}$ of the periods of the electric current in the learning mode 220, it is possible to obtain frequency information on the electric current 31 (which is associated to the frequency of the oscillation). Therefore, learning mode periods $T_{LM,1}$, $T_{LM,2}$, $T_{LM,3}$ of the electric current 31 may be obtained. The obtained learning mode periods $T_{LM1}$, $T_{LM,2}$, $T_{LM,3}$ may be averaged (e.g., average of multiple consecutive learning mode periods, such as three consecutive learning mode periods), so as to obtain an average frequency information.

The fulfilment of a second timing-related condition may be checked (e.g. by the controller 10) in the learning mode 220. The second timing-related condition may be associated to the determination that, in the learning mode 220, the electric current has crossed a zero value, e.g. from a positive value towards a negative value or vice versa, e.g., for a preselected number of times. The fulfilment of the second timing-related condition is indicated with 62 in FIG. 2: in this case, it is fulfilled when three zero-crossing events from positive to negative are counted: two zero-crossing events 61'' from positive to negative+ the final zero-crossing event 62; the zero-crossing events 61', from negative to positive, are not necessarily taken into account. (In other examples, also the zero-crossing events 61', from negative to positive, may be considered. These crossing events 61' represent the time where the turning point of the oscillation is happening, i.e. the amplitude point.)

At the determination of fulfilment of the second timing-related condition 62, a third, closed loop mode 230 may be initiated (e.g., by the controller 10). At this point, the controller 10 knows timing information associated to the electric current 31: the frequency of the electric current 31 may be obtained (e.g., by averaging) by the determination of the periods $T_{LM1}$, $T_{LM,2}$, $T_{LM,3}$, while the phase may be obtained from the zero-crossing conditions (e.g., 62, 63) on the electric current. Accordingly, starting from the first period $T_{CL,1}$ of the closed loop mode 230, the power driver 20 may generate an electric excitation 21 as a discontinuous electric signal.

Subsequently (e.g., at the subsequent period $T_{CL,2}$), the timing of the period $T_{CL,2}$ may be defined on the basis of the detection of a zero-value condition of the electric current 31 (e.g., indicated as 63). Accordingly, also in the subsequent time period $T_{CL,2}$ of the closed loop mode, timing information will be derived from the feedback measurement signal 41 provided to the controller 10.

In examples, the controller 10 may be configured to immediately switch off the excitation signal 21 at the determination of a further (third) timing-related condition, which may be based on the electric current 31 traversing the zero value. Therefore, in the closed loop mode 230, the electric excitation 21 may be switched off at the determination that the electric current 31 has crossed a zero value. This implies that the electric excitation 21 is in phase with the detected feedback measurement signal 41. By virtue of the definition of the period of the electric excitation 21 on the basis of the previous period of the electric current, the system 50 in the closed loop mode may be understood as operating like a PLL synchronized with the feedback measurement signal 41 (and the oscillation, as well).

In the closed loop mode 230, each period (respectively $T_{CL,1}$, $T_{CL,2}$, etc.) may be formed by:

a first part (respectively $T_{CL,OFF,1}$, $T_{CL,OFF,2}$, etc.) of the period (respectively $T_{CL,1}$, $T_{CL,2}$, etc.), in which the electric excitation 21 is zero, or OFF; and a second, subsequent part (respectively $T_{CL,ON,1}$, $T_{CL,ON,2}$, etc.) of the period (respectively $T_{CL,1}$, $T_{CL,2}$, etc.), in which the electric excitation 21 is different from zero (e.g., a continuous value), or ON.

The first part (respectively $T_{CL,OFF,1}$, $T_{CL,OFF,2}$, etc.) of each period (respectively $T_{CL,1}$ $T_{CL,2}$, etc.) may be initiated at the determination of the zero-crossing (respectively 62, 63, etc.) in the preceding period (respectively $T_{LM3}$, $T_{CL,1}$, etc.). The duration of the first part (respectively $T_{CL,OFF,1}$, $T_{CL,OFF,2}$, etc.) of each period (respectively $T_{CL,1}$, $T_{CL,2}$, etc.) may be determined by the controller 10 on the basis of measured duration(s) of the previous periods. For example, for determining $T_{CL,OFF,1}$, the controller 10 may calculate an average of the time periods ($T_{LM,1}$, $T_{LM,2}$, $T_{LM,3}$) in the learning mode. For determining $T_{CL,OFF,2}$, the controller 10 may perform $$T_{CL,OFF,2} = \frac{T_{CL,1}}{2},$$

and so on.

The second part (respectively $T_{CL,ON,1}$, $T_{CL,ON,2}$, etc.) of each period (respectively $T_{CL,1}$ $T_{CL,2}$, etc.) may be initiated when the previously-calculated duration of the respective first part (respectively $T_{CL,OFF,1}$, $T_{CL,OFF,2}$, etc.) of each period (respectively $T_{CL,1}$, $T_{CL,2}$, etc.) is elapsed. The duration of the second part (respectively $T_{CL,ON,1}$, $T_{CL,ON,2}$, etc.) of each period (respectively $T_{CL,1}$, $T_{CL,2}$, etc.) is not a priori determined by the controller 10, but is instantaneously triggered by the determination of a zero-crossing condition.

Accordingly, in the closed loop mode 230 the electric excitation 21 starts to be OFF when the zero-crossing event is detected and remains OFF for a time duration (e.g., $T_{CL,OFF,1}$, $T_{CL,OFF,2}$, etc.) which is based on the previously-measured time period. After that, the electric excitation 21 starts to be ON up to the detection of a zero-crossing condition. The excitation 21 may therefore be a square (or rectangular or bistate) signal with variable duty cycle, and synchronized with the current 31 (and with the oscillations, as well).

(In FIG. 2, impulses 33 and 33' in FIG. 2 are only measurement artefacts and are caused by switching transients, which may be suppressed using known techniques.)

Reference is now made to the above-mentioned timing-related conditions. It is not necessary that the timing-related conditions are zero-crossing conditions. For example, values different from zero may be monitored. Further, the timing-related conditions may be conditions on the electric current 31, detected as feedback measurement 41. In the example of FIG. 2, the zero-crossing conditions are bound to zero-crossing events 61, 62, 63, etc.

In order to increase the reliability of the detections of the zero-crossing events, at least one of the first, second, and third conditions may include:

a pre-condition associated to the feedback measurement signal 41 crossing a pre-threshold value (e.g., a positive value or, in alternative examples, a negative value); and a final condition associated to the feedback measurement signal 41 crossing a final threshold value (e.g. a zero value) different from the pre-threshold value.

The timing-related conditions may be considered to be satisfied when both the pre-condition and the final condition are fulfilled. Accordingly, it is possible to determine whether the timing-related crossing condition indicates the electric current 31 crossing from a positive value to a negative value (or, in alternative examples, from a negative value to a positive value). Accordingly, the zero-crossing events 61' may result undetected (and do not participate to the determination of the second timing-related condition): only the zero-crossing events 61, 62, 63 from positive value to negative value may be taken into consideration (other techniques may be defined). By splitting a timing-related condition into a pre-condition and a final condition, an increased reliability is also obtained, and false detections may be consequently tolerated.

In the present system, the mechanical oscillations have in general a frequency which is the double of the electric current. The electric current is zero both at the maximum amplitude of the oscillations (e.g., reached in correspondence of the events 61'), and at the oscillation being at a zero position of the oscillator (e.g., reached in correspondence of the events 61"). As explained above, $$I = \frac{dC}{dt},$$

or equivalently $$I = \frac{dC}{d\theta}\frac{d\theta}{dt},$$

with $$\frac{d\theta}{dt}$$

being the angular velocity of the oscillator. At events 61", dC/dθ=0, implying I=0 (with $$\frac{dI}{dt} < 0\bigg).$$

At events 61', $$\frac{d\theta}{dt} = 0,$$

also implying $$I = 0 \left(\text{but } \frac{dI}{dt} > 0\right).$$

The events 61" are those which in are preferably counted for determining the length of the learning window, while the events 61' may be disregarded (even tough in some examples they may also be taken into account).

Figure 4:
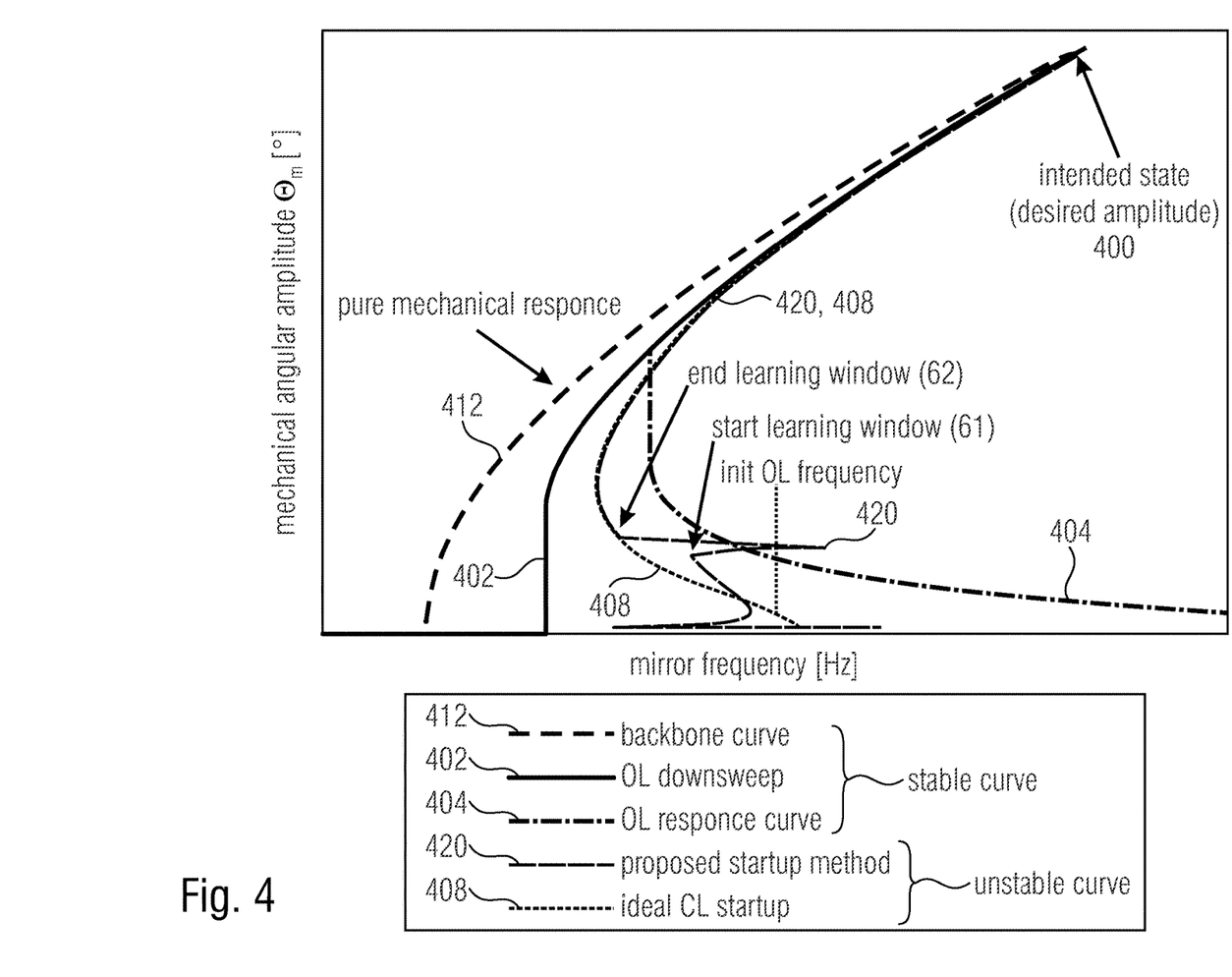
FIGS. 4 and 5 show state graphs according to different examples.

Reference is now made to FIG. 4, which is a graph illustrating amplitude (e.g., mechanical amplitude) of the oscillations over frequency relationships of stable and unstable oscillator responses (e.g., MEMS mirror responses). As explained above, specific relationships between amplitudes and mechanical frequencies are depicted in stable and unstable curves along which the oscillator may sweep. It is requested to cause an oscillation (e.g., of a mirror for a LIDAR system) at the intended stable state 400, which associates a desired angular amplitude with a frequency to be provided to the electric excitation 21. A backbone curve 412 shows the mechanical response in the absence of excitation.

By virtue of the physics of the oscillator, there may be recognized a first and a second stable response curves 402 (OL downsweep curve) and 404 (OL response curve). By slowly moving along the stable curve 404, for example, it would be possible to arrive at the intended state 400.

An ideal unstable startup curve 408, obtained by simulation, is also depicted. It is however not feasible to simply intercept the unstable startup curve 408, as it is difficult to obtain timing information at low oscillation.

However, it has been understood that, by implementing examples as above (indicated by the curve 420), the unstable curve 408 may be quickly and easily intercepted. At the end of the learning mode 220, when the electric excitation 21 is synchronized with the feedback measurement signal 41 (and the oscillation in turn), the controller 10 will simply spontaneously follow the unstable startup curve 408 towards the intended state 400. After the end of the learning mode, the curves 408 and 420 coincide.

Figure 5:
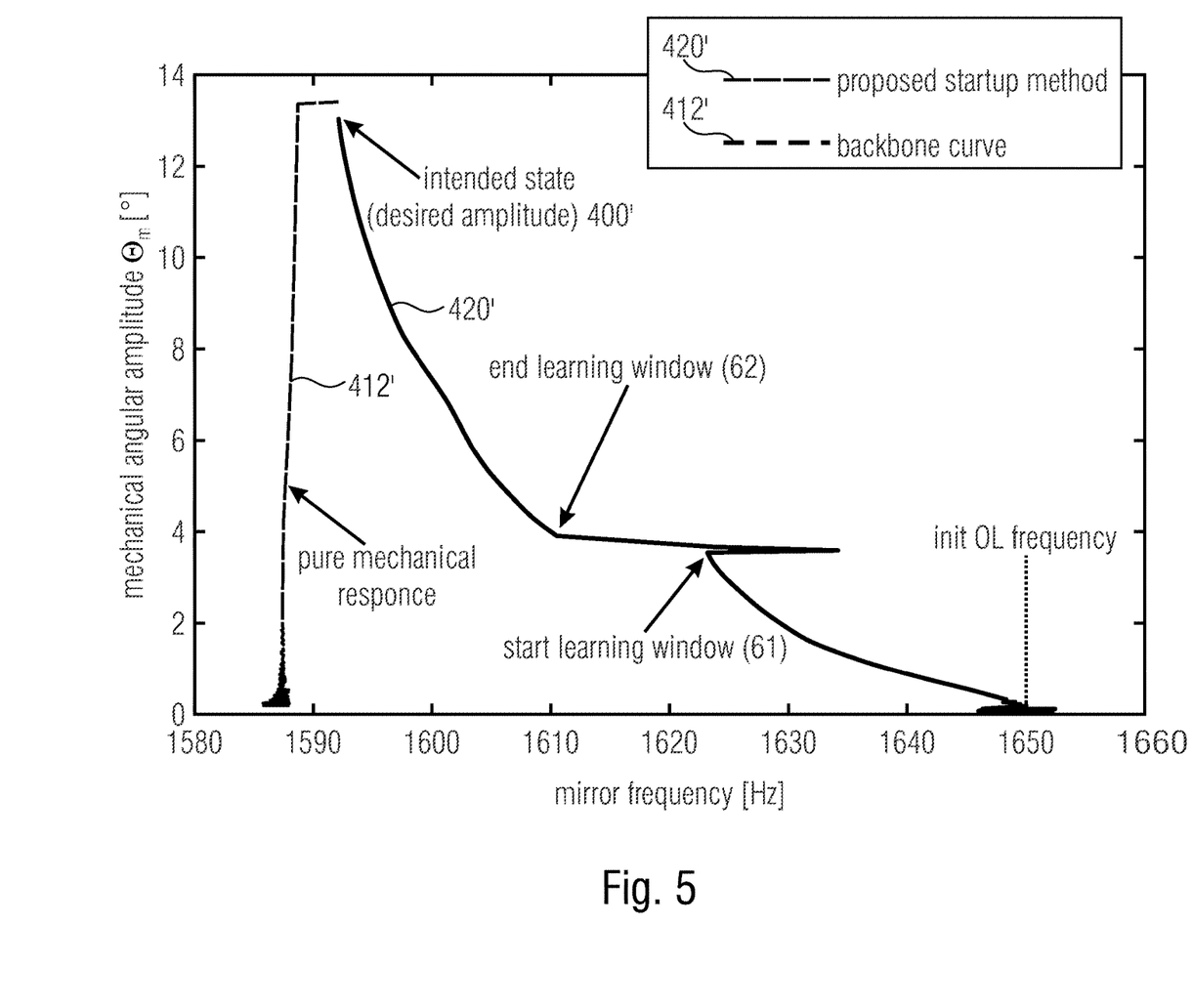

While FIG. 4 refers to a MEMS mirror with an over bending behavior (i.e. nonlinear stiffness), FIG. 5 shows the same technique for a mirror with linear spring (e.g., a mirror from Fraunhofer, Germany). Analogous concepts shown in FIGS. 4 and 5 are distinguished by an apex.

In view of the above, the present examples permit to quickly arrive at the desired amplitude by following the unstable curve 408. By synchronizing the excitation signal to the feedback measurement signal (and to the oscillation, in turn), the intended state is quickly and easily achieved. In order to permit the synchronization, a learning mode may permit to obtain promptly and reliably the knowledge of the timing of the feedback measurement signal. The learning mode may be reliably initiated at the recognition of particular conditions (e.g., zero-crossing condition). Accordingly, the initial transient may be easily and quickly managed by the controller. The controller does not need to have, at the startup, any particular capability. At least for the initial transient, the controller does not need to take into account the angular amplitudes, which do not need to be initially measured.

An advantage is also obtained as zero-crossing conditions may be easily detected, in the learning mode, by virtue of the voltage being different from zero. With the conventional current-based techniques, it is in general not possible to perform zero-crossing measurements if the voltage is off. The present examples also avoid the use of special sensors and/or complicated circuitry (at least for the transient phase), which should be necessary to perform phase measurements at low amplitudes.

Figure 6:
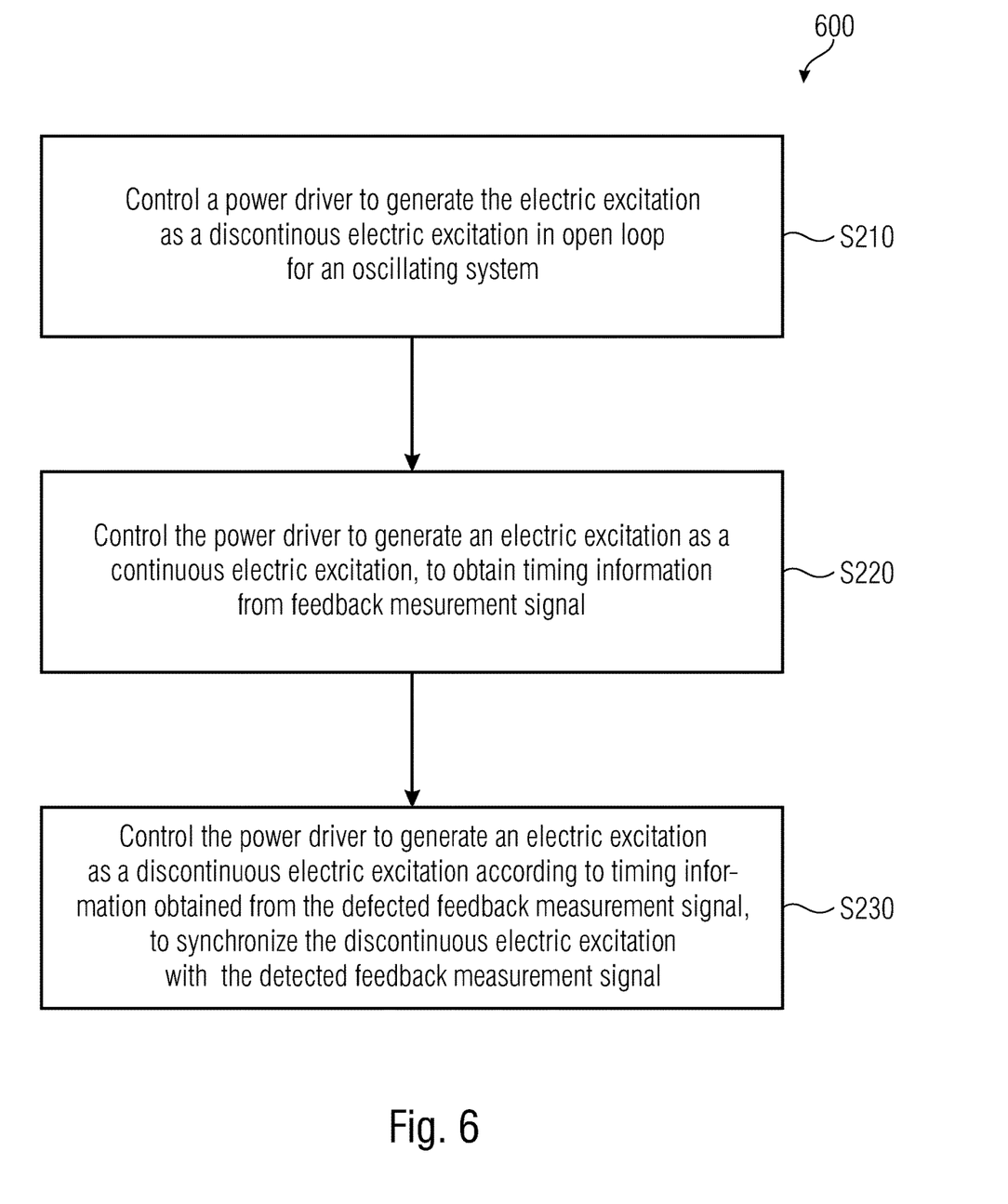
FIG. 6 shows a method according to an example.

FIG. 6 shows a method (which may be implemented with any of the equipment discussed above). The method 600 may be implemented by the controller 10. The method 600 may include at least one of the following steps:

an initial open loop step (S210), to control a power driver (20) to generate the electric excitation (21) as a discontinuous electric excitation in open loop; and a learning step (S220), to control the power driver (20) to generate an electric excitation (21) as a continuous electric excitation, to obtain timing information from feedback measurement signal (41); and a closed loop step (S230), to control the power driver (20) to generate the electric excitation (21) as a discontinuous electric excitation according to timing information obtained from the detected feedback measurement signal (41), to synchronize the discontinuous electric excitation (21) with the detected feedback measurement signal (41).

It is also possible to have a non-transitory memory unit storing instructions which, when executed by a processor (e.g., controller 10), cause the processor to perform the method 600 or any of the functions described above.

An application of the techniques above is here discussed. The system 50 may be applied to a laser scanning control system (e.g., a LIDAR system), comprising control equipment to perform a coordinated scanning control by controlling:

the oscillating mirror system 30, to cause the oscillation of the mirror along desired mirror positions through a motion mirror control signal; and a laser driver, to cause the generation of laser light pulses to be impinged onto the mirror.

Figure 7:
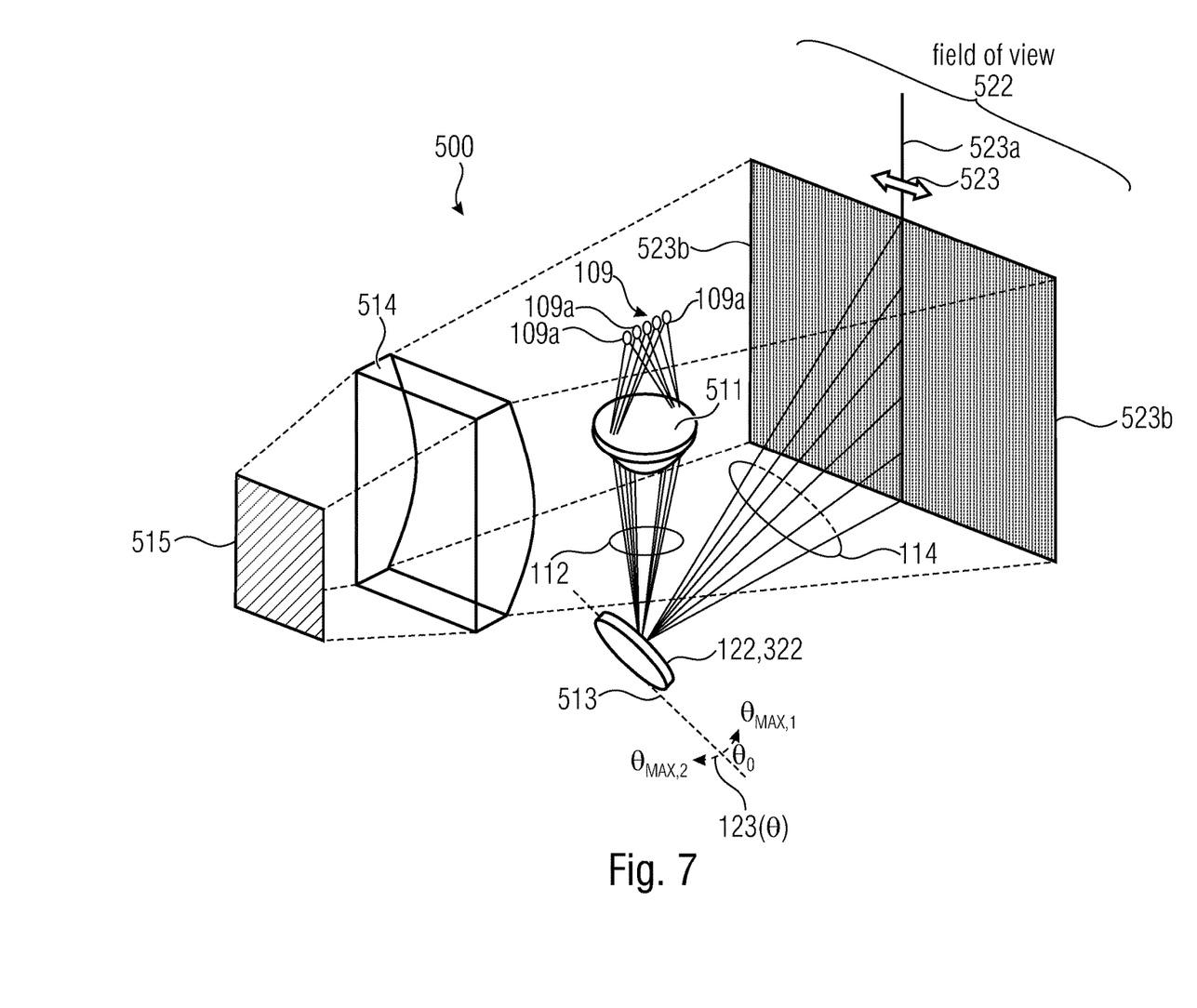
FIG. 7 shows a LIDAR system according to an example.

An example is provided in FIG. 7 which schematically shows a LIDAR system.

LIDAR is a remote sensing technique that uses light in the form of a pulsed laser to measure ranges (variable distances) to one or more objects in a field of view. In particular, the mirror 35 (which may be associated to the oscillating system 30) may be used to scan light across the field of view 522. A reception unit 514 may be used to receive a response light beam.

In general, the mirror 35 may be impinged by light pulses 112 to obtain reflected light pulses 114 directed according to directions defined by the position of the mirror 35. The mirror 35 may oscillate about a scanning axis (e.g., one single axis) 513. The mirror 35 may have one single degree of freedom for movement (e.g., only around axis 513, e.g., operating as an 1D MEMS mirror). Forced by the action of the power driver 20, the mirror 35 may oscillate, e.g., "side-to-side" about the scanning axis 513. This action may permit to reflect light 112 according to different directions 523 associated to the positions 123 (e.g., angles θ) taken by the mirror 35. The mirror 35 may oscillate (e.g., back-and-forth) in scanning directions.

An illumination unit 109 may be used for generating the light pulses 112. The illumination unit 109 may include at least one light source 109a (e.g., a plurality of light sources 109b. The at least one light source 109a may include laser diode(s) or light emitting diode(s). A plurality of light sources 109a may be configured as an array (or matrix) of linearly aligned light sources 109a. The light pulses 112 emitted by the light source(s) 109a may be infrared light, although light with other wavelength might also be used in some examples. As can be seen from FIG. 7, the shape of the light emitted by the light sources 109a may be spread in a direction perpendicular to a transmission direction to form a light beam with an oblong shape perpendicular to a transmission. The illumination light transmitted from the light source(s) 109a may be directed towards the mirror 35.

Between the light source(s) 109a and the mirror 35, a transmitter optics 511 may be interposed. The transmitter optics 511 may be configured to focus each the laser light 112 onto the mirror 35. The transmitter optics 511 may be, for example, a lens or a prism. When reflected by the mirror 35, the rays of the light emitted from the light sources 109a may be aligned vertically to form a one-dimensional vertical scanning line of infrared light or a vertical bar of infrared light. Each light source(s) 109a (e.g., photodiode) of the illumination unit 109 may contribute to a different vertical region of a vertical scanning line 523a. While five laser sources 109a are shown in FIG. 5, it will be appreciated that the number of laser sources 109a are not limited thereto. For example, the vertical scanning line 523a may be generated by a single laser source 109a, two laser sources 109a, and so on. It will also be appreciated that the light sources 109a may be arranged in a matrix formation.

A controller (e.g., the controller 10) may be used to perform a ranging on the basis of the response light beam. Arrays of photodetectors 515 receive reflections from objects illuminated by the light (114, 314,) irradiated by the photodiodes 109a of the illumination unit 109, and the time necessary for the reflections to arrive at various sensors in the photodetector array 515 is determined. This is also referred to as measuring time-of-flight (TOF). The LIDAR system 500 forms depth measurements and makes distance measurements by mapping the distance to objects based on the time-of-flight computations. Thus, the time-of-flight computations can create distance and depth maps, which may be used to generate images. (The operations discussed above for generating the light pulses 112 and for reflecting them towards scanning areas of the field of view 522 are here not repeated.) The photodetector array 515 can be any of a number of photodetector types; including avalanche photodiodes (APD), photocells, and/or other photodiode devices. Imaging sensors such as charge-coupled devices (CCDs) can be the photodetectors. In the examples provided herein, the photodetector array 515 is a two-dimensional (2D) APD array that comprises an array of APD pixels. In other embodiments, the photodetector array 515 may be a 1D array that includes a single column of photodiodes. The activation of the photodiodes 515 may be synchronized with light pulses emitted by the illumination unit 109. In examples, for each distance sampling, a microcontroller triggers a laser pulse from each of the light sources 109a of the illumination unit 509 and also starts a timer in a Time-to-Digital Converter (TDC) Integrated Circuit (IC). The laser pulse (112, 114, 312, 314) is propagated through the transmission optics, reflected by the target field, and captured by an APD of the APD array 515. The APD array 515 may emit a short electrical pulse which may then be amplified by an electrical signal amplifier. A comparator IC may recognize the pulse and send a digital signal to the TDC to stop the timer. The TDC uses a clock frequency to calibrate each measurement. The TDC may send the serial data of the differential time between the start and stop digital signals to the microcontroller, which filters out any error reads, averages multiple time measurements, and calculates the distance to the target at that particular field position. By emitting successive light pulses in different directions (scanning directions) established by the mirror 35, an area can be scanned, a three-dimensional image can be generated, and objects within the area can be detected.

The mirror 35 of the LIDAR system 500 may implement the oscillator of the oscillating system 30. The power driver 20 may operate, at the startup (initial transient), as explained above, and may operating at least in one of the initial open loop mode 210, the learning mode 220, and the closed loop mode 230.

Generally, examples can be implemented as a computer program product with a program code, the program code being operative for performing one of the methods when the computer program product runs on a computer. The program code may for example be stored on a machine-readable carrier.

Other examples comprise the computer program for performing one of the methods described herein, stored on a machine-readable carrier.

In other words, an example of method is, therefore, a computer program having a program code for performing one of the methods described herein, when the computer program runs on a computer.

A further example of the methods is, therefore, a data carrier (or a digital storage medium, or a computer-readable medium) comprising, recorded thereon, the computer program for performing one of the methods described herein. The data carrier, the digital storage medium or the recorded medium are typically tangible and/or non-transitory.

A further example of the method is, therefore, a data stream or a sequence of signals representing the computer program for performing one of the methods described herein. The data stream or the sequence of signals may for example be configured to be transferred via a data communication connection, for example via the Internet.

A further example comprises a processing means, for example a computer, or a programmable logic device, configured to or adapted to perform one of the methods described herein.

A further example comprises a computer having installed thereon the computer program for performing one of the methods described herein.

A further example comprises an apparatus or a system configured to transfer (for example, electronically or optically) a computer program for performing one of the methods described herein to a receiver. The receiver may, for example, be a computer, a mobile device, a memory device or the like. The apparatus or system may, for example, comprise a file server for transferring the computer program to the receiver.

In some examples, a programmable logic device (for example a field programmable gate array) may be used to perform some or all of the functionalities of the methods described herein. In some examples, a field programmable gate array may cooperate with a microprocessor in order to perform one of the methods described herein. Generally, the methods are preferably performed by any hardware apparatus.

The apparatus described herein may be implemented using a hardware apparatus, or using a computer, or using a combination of a hardware apparatus and a computer.

The apparatus described herein, or any components of the apparatus described herein, may be implemented at least partially in hardware.

The methods described herein may be performed using a hardware apparatus, or using a computer, or using a combination of a hardware apparatus and a computer.

The methods described herein, or any components of the apparatus described herein, may be performed at least partially by hardware.

The above described examples are merely illustrative for the principles discussed above. It is understood that modifications and variations of the arrangements and the details described herein will be apparent to others skilled in the art. It is the intent, therefore, to be limited only by the scope of the impending patent claims and not by the specific details presented by way of description and explanation of the examples herein.

What is claimed is:

1. A system, comprising:
    a power driver configured to generate an electric excitation;
    an oscillating system configured to perform an oscillation induced by the electric excitation;
    a feedback detector configured to detect a feedback measurement signal associated with the oscillation; and
    a controller configured to operate:
        in a closed loop mode, to control the power driver to generate the electric excitation as a closed loop discontinuous electric excitation according to timing information obtained from the detected feedback measurement signal, to synchronize the closed loop discontinuous electric excitation with the detected feedback measurement signal, and
        in a learning mode preceding the closed loop mode, to control the power driver to generate the electric excitation as an entirely continuous electric excitation, to obtain the timing information from the detected feedback measurement signal to be used, at least once, in the closed loop mode, to synchronize the closed loop discontinuous electric excitation with the detected feedback measurement signal.

2. The system of claim 1, wherein the controller is configured to operate:
    in an initial open loop mode preceding the learning mode, so as to control the power driver to generate the electric excitation as an open loop discontinuous electric excitation in the absence of synchronization with the feedback measurement signal.

3. The system of claim 2, wherein the controller is configured, in the open loop mode, to:
    evaluate a first timing-related condition to determine whether to initiate the learning mode.

4. The system of claim 3, wherein the controller is configured, in the learning mode, to:
    evaluate a second timing-related condition to determine whether to initiate the closed loop mode.

5. The system of claim 4, wherein the controller is configured, in the closed loop mode, to:
    evaluate a third timing-related condition to update the timing information.

6. The system of claim 4, wherein the controller is configured, in the closed loop mode, to:
    evaluate a third timing-related condition as a condition to modify the electric excitation so that the electric excitation is in phase with the feedback measurement signal.

7. The system of claim 6, wherein the controller is configured to control the power driver to change a voltage level of the electric excitation from a non-zero voltage level to a zero voltage level in response to detecting at least one of the second timing-related condition or the third timing-related condition.

8. The system of claim 6, wherein at least one of the first, the second, and third timing-related conditions is a condition associated to the feedback measurement signal crossing, respectively, a first threshold value, a second threshold value, and a third threshold value, wherein the first threshold value, the second threshold value, and the third threshold value are the same value or different values.

9. The system of any of claim 6, wherein at least one of the first, the second, and the third timing-related conditions comprises both:
- a pre-condition associated to the feedback measurement signal crossing a pre-threshold value; and
- a final condition associated to the feedback measurement signal crossing a final threshold value different from the pre-threshold value, so that the at least one of the first, the second, and the third timing-related conditions is satisfied when both the pre-condition and the final condition are fulfilled.

10. The system of claim 4, wherein the feedback detector is configured to detect the feedback measurement signal in correspondence with a switched-on status of the power driver in the closed loop mode and in the learning mode.

11. The system of claim 1, wherein the controller is configured, in the closed loop mode, to synchronize a frequency of the electric excitation with another frequency of the feedback measurement signal.

12. The system of claim 1, wherein the feedback measurement signal corresponds to electric current at the oscillating system.

13. The system of claim 1, wherein the feedback measurement signal provides information on a time instant in which a determined timing-related condition has been fulfilled.

14. The system of claim 1, wherein the oscillation system includes an oscillating mirror and an actuator driven by the power driver for moving the oscillating mirror.

15. The system of claim 1, wherein the controller is configured to control the power driver to generate—an excitation signal such that:
- for a first part of each period of the excitation signal in the closed loop mode, the excitation signal is zero; and
- for a second part of each period of the excitation signal in the closed loop mode, the excitation signal is different from zero, wherein the second part of each period is subsequent to the first part of each period.

16. The system of claim 15, wherein the controller is configured, in the closed loop mode, to define a time length of the first part of a new period of the excitation signal based on at least one of a time length of a previous period of the excitation signal or the timing information obtained in the learning mode.

17. The system of claim 4, wherein the controller is configured, in the closed loop mode, to evaluate a third timing-related condition and trigger a new period of the excitation signal at the determination that the third timing-related condition has been fulfilled.

18. The system of claim 1, wherein the oscillating system is configured, in the closed loop mode, to intercept a non-stable operating curve, so as to move along the non-stable operating curve towards a desired stable state.

19. The system of claim 1, wherein the oscillation system includes a micro-mechanical electric system.

20. The system of claim 1, wherein the oscillation system is configured, in the closed loop mode, to operate in an unstable response curve moving towards a desired amplitude state.

21. A light detection and ranging (LIDAR) system, comprising:
- a power driver configured to generate an electric excitation;
- an oscillating system configured to perform an oscillation induced by the electric excitation;
- a feedback detector configured to detect a feedback measurement signal associated with the oscillation; and
- a controller configured to operate:
  - in a closed loop mode, to control the power driver to generate the electric excitation as a closed loop discontinuous electric excitation according to timing information obtained from the detected feedback measurement signal, to synchronize the closed loop discontinuous electric excitation with the detected feedback measurement signal, and
  - in a learning mode preceding the closed loop mode, to control the power driver to generate the electric excitation as a continuous electric excitation, to obtain the timing information from the detected feedback measurement signal to be used, at least once, in the closed loop mode, to synchronize the closed loop discontinuous electric excitation with the detected feedback measurement signal,
- wherein the oscillating system includes a mirror, wherein the LIDAR system further comprises control equipment configured to perform a scanning control by controlling a laser driver to cause the generation of laser light pulses to be impinged onto the mirror.

22. A method, comprising:
- operating in an initial open loop mode, to control a power driver to generate an electric excitation as an open loop discontinuous electric excitation in an open loop for an oscillating system;
- operating in a learning mode, to control the power driver to generate the electric excitation as an entirely continuous electric excitation to obtain timing information from a feedback measurement signal; and
- operating in a closed loop mode, to control the power driver to generate the electric excitation as a closed loop discontinuous electric excitation in a closed loop according to the timing information obtained from the feedback measurement signal, to synchronize the closed loop discontinuous electric excitation with the feedback measurement signal.

23. A non-transitory computer-readable medium configured to store instructions which, when executed by a processor, causes the processor to perform the method of claim 22.

* * * * *